United States Patent
Lee et al.

(10) Patent No.: US 7,939,917 B2
(45) Date of Patent: May 10, 2011

(54) TAPE STRUCTURES, AND METHODS AND APPARATUSES FOR SEPARATING A WAFER USING THE SAME

(75) Inventors: Chang-Hoon Lee, Cheonan-si (KR);
Jong-Keun Jeon, Cheonan-si (KR);
Yong-Jin Lee, Cheonan-si (KR);
Soon-Ju Choi, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 281 days.

(21) Appl. No.: 12/232,085

(22) Filed: Sep. 10, 2008

(65) Prior Publication Data

US 2009/0068819 A1     Mar. 12, 2009

(30) Foreign Application Priority Data

Sep. 11, 2007  (KR) ........................ 10-2007-0092030

(51) Int. Cl.
*H01L 23/552*  (2006.01)
*H01L 21/00*  (2006.01)

(52) U.S. Cl. ......... 257/659; 257/E23.018; 257/E23.055; 257/E21.514; 438/464

(58) Field of Classification Search ............ 257/659, 257/E23.108, E23.055, E21.514; 438/464
See application file for complete search history.

(56) References Cited

U.S. PATENT DOCUMENTS

| | | | | |
|---|---|---|---|---|
| 5,266,528 A * | 11/1993 | Yamada | ............ | 83/49 |
| 6,176,933 B1 | 1/2001 | Yang | | |
| 6,741,221 B2 * | 5/2004 | Aisenbrey | ............ | 343/897 |
| 6,943,288 B1 * | 9/2005 | Miska | ............ | 174/388 |
| 2006/0065426 A1 * | 3/2006 | Anderson | ............ | 174/71 R |

FOREIGN PATENT DOCUMENTS

| KR | 10-1999-0066162 | 8/1999 |
|---|---|---|
| KR | 10-2006-0081752 | 7/2006 |

\* cited by examiner

*Primary Examiner* — W. David Coleman
(74) *Attorney, Agent, or Firm* — Harness, Dickey & Pierce, P.L.C.

(57) ABSTRACT

Example embodiments provide tape structures including a base layer, a neutralizing layer and an adhesive layer. The base layer may support an object. The neutralizing layer may be arranged on the base layer. The neutralizing layer may be grounded to neutralize charges between the base layer and the object. The adhesive layer may be arranged on the neutralizing layer. The object may be attached to the adhesive layer. Example embodiments also provide methods of manufacturing the tape structures, methods of separating a wafer, and apparatuses for separating a wafer.

24 Claims, 5 Drawing Sheets

TAPE STRUCTURES, AND METHODS AND APPARATUSES FOR SEPARATING A WAFER USING THE SAME

PRIORITY STATEMENT

This application claims priority under 35 U.S.C. §119 to Korean Patent Application No. 2007-92030 filed on Sep. 11, 2007 in the Korean Intellectual Property Office (KIPO), the contents of which are herein incorporated by reference in their entirety.

BACKGROUND

1. Field

Example embodiments are directed to tape structures, and methods and apparatuses for separating wafers using the same. Example embodiments of the tape structures may be capable of being grounded.

2. Description of the Related Art

A semiconductor fabricating process may include a process for separating a wafer into semiconductor chips using a diamond blade. The separating process may use an expanding tape to fix the wafer. When the wafer is attached to the expanding tape or the semiconductor chips are separated from the expanding tape, static electricity may be generated between a lower surface of the semiconductor chip and the expanding tape. The static electricity may deform and break elements and patterns in the semiconductor chip. Also, since the wafer may have become larger, thinner and lighter during processing, the wafer may have an increased vulnerability to the static electricity.

For example, when a semiconductor chip is attached to or separated from a conventional expanding tape, both the semiconductor chip and the expanding tape may have static charges. The static charges may be continuously accumulated and may cause a static charge imbalance that may generate voltage suppression. The static electricity may be discharged, e.g., sequentially through a lower surface of the semiconductor chip, an upper surface of the semiconductor chip, a suction collet (e.g., used to separate the wafer into chips), a shaft of the suction collet, various equipment components, and a ground. The static electricity discharged during this process may affect the elements and the patterns in the semiconductor chip, so that the elements and the patterns in the semiconductor chip may be deformed and/or broken.

SUMMARY

Example embodiments provide tape structures that may be capable of being grounded. Example embodiments also provide methods of manufacturing the tape structures. Example embodiments further provide methods of separating a wafer using the tape structures and apparatuses for cutting a wafer using the tape structures. Example embodiments also provide apparatuses for separating a wafer using the tape structures.

Example embodiments of tape structures may include at least a base layer, a grounded neutralizing layer and/or an adhesive layer. The base layer may support an object. The neutralizing layer may be on the base layer. Further, the neutralizing layer may neutralize charges between the base layer and the object. The adhesive layer may be on the neutralizing layer. The object may be attached to the adhesive layer. According to example embodiments the neutralizing layer may include a conductive metal layer and have a thickness of about 10 μm to about 30 μm. The neutralizing layer may be a foil, a mesh, etc.

Methods of manufacturing the tape structures in accordance with example embodiments may include providing the base layer, forming the neutralizing layer on the base layer and forming the adhesive layer on the neutralizing layer. The object may be attached to the adhesive layer and supported by the base layer. The neutralizing layer may neutralize charges between the base layer and the object.

Example embodiments of methods for separating a wafer provide attaching the wafer to the tape structure and cutting the wafer to divide the wafer into a plurality of semiconductor chips. The semiconductor chips may be further separated from the tape structure. The wafer may be cut from an upper surface of the neutralizing layer to a lower surface of the neutralizing layer to prevent the neutralizing layer from being completely cut.

Example embodiments of the tape structures may include a base layer, a grounded neutralizing layer and an adhesive layer. The base layer may support an object. The neutralizing layer may be on the base layer. Further, the neutralizing layer may neutralize charges between the base layer and the object. The adhesive layer may be on the neutralizing layer. The object may be attached to the adhesive layer. According to additional example embodiments the neutralizing layer may include a conductive metal layer and have a thickness of about 10 μm to about 30 μm. The neutralizing layer may be a foil, a mesh, etc.

Example embodiments also include apparatuses for separating a wafer in accordance with example embodiments. The apparatus may include the tape structure (as discussed above) and a cutting unit for cutting the wafer on the tape structure to divide the wafer into a plurality of semiconductor chips. Example embodiments may further include a separating unit for separating the cut semiconductor chips from the tape structure. The separating unit may include a suction collet. The cutting unit may cut the wafer from an upper surface of the neutralizing layer to a lower surface of the neutralizing layer to prevent the neutralizing layer from being completely cut. The cutting unit may also include a diamond blade.

BRIEF DESCRIPTION OF THE DRAWINGS

Example embodiments will be more clearly understood from the following detailed description taken in conjunction with the accompanying drawings.

FIG. 1 is a cross-sectional view illustrating a tape structure in accordance with example embodiments;

FIGS. 2 to 4 are cross-sectional views illustrating a method of manufacturing the tape structure in FIG. 1;

FIGS. 5 and 6 are cross-sectional views illustrating an apparatus for separating a wafer in accordance with example embodiments; and FIGS. 7 to 9 are cross-sectional views illustrating a method of separating a wafer in accordance with example embodiments.

DETAILED DESCRIPTION OF EXAMPLE EMBODIMENTS

Figure 1:
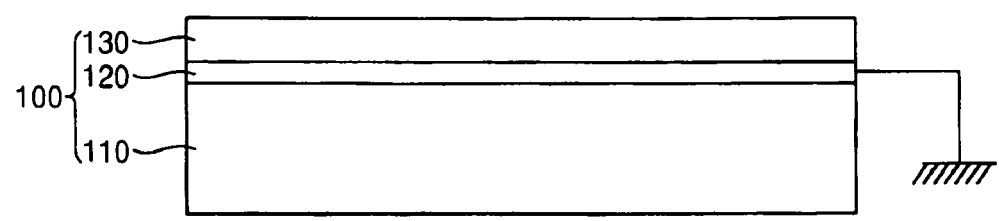
FIGS. 1-9 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

FIG. 1 is a cross-sectional view illustrating a tape structure in accordance with example embodiments. Referring to FIG. 1, a tape structure 100 may include a base layer 110, a neutralizing layer 120 and an adhesive layer 130. The base layer 110 may act as a substrate on which the neutralizing layer 120 and the adhesive layer 130 may be arranged. Further, the base layer 110 may support an object, e.g., a wafer. The base layer 110 may include, e.g., a polyethylene layer, a polypropylene layer, a polybutane layer, a polymethylpentene layer, a polyvinyl chloride layer, a polyethylene terephthalate layer, a polybutylene terephthalate layer, a polybutadiene layer, a polyurethane layer, a polyolefin layer (e.g., an ethylene/vinyl acetate layer), etc.

The neutralizing layer 120 may be on the base layer 110 as shown. The neutralizing layer 120 may be grounded to neutralize charges between the base layer 110 and an object. The grounded neutralizing layer 120 may neutralize the charges accumulated by static electricity generated when an object is attached to or separated from the adhesive layer 130. The neutralizing layer 120 may include a conductive metal (e.g., having a high electric conductivity), e.g., aluminum (Al), copper (Cu), nickel (Ni), gold (Au), silver (Ag), platinum (Pt), alloys thereof, etc.

Further, the neutralizing layer 120 may have a thickness capable of preventing the neutralizing layer 120 from being entirely cut during separating. The thickness of the neutralizing layer 120 may be determined based in part, for example, on the cost of manufacturing the tape structure 100, storage of the tape structure 100, utilization convenience of the tape structure 100, etc. The thickness of the neutralizing layer 120 may range from, e.g., about 10 μm to about 30 μm. Further, the neutralizing layer 120 may be formed as a foil or a mesh, allowing for expansion of the neutralizing layer 120 and the tape structure 100 when required and to reduce the cost.

The adhesive layer 130 may be arranged on the neutralizing layer 120. An object (e.g., a wafer) may be attached to the adhesive layer 130. Examples of the adhesive layer 130 may include rubber, e.g., acryl, silicon, polyvinyl ether, radiation-hardened materials, heat-foamed type decompression cohesive agents, materials having sufficient adhesion strength with an object adhered thereto and when partially cut, etc. According to example embodiments, the neutralizing layer 120 of the tape structure 100 may be grounded, for example, so static electricity, which may deform and break the object, may not be generated between the tape structure 100 and the object.

Figure 2:
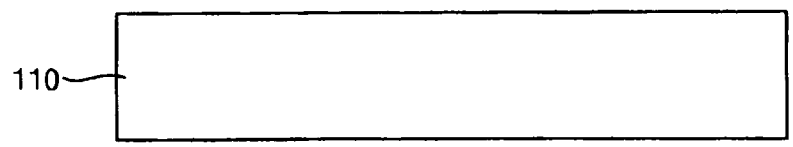
Figure 3:
Figure 4:
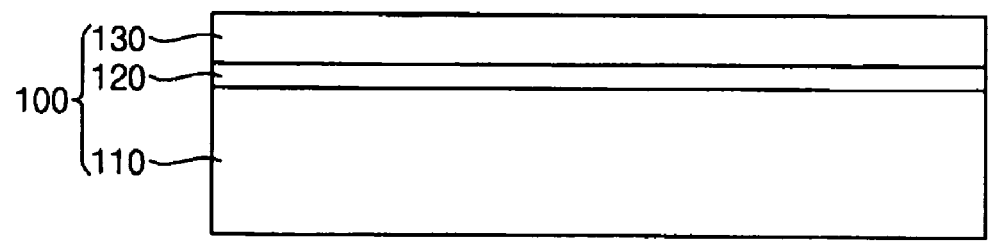

FIGS. 2 to 4 are cross-sectional views illustrating a method of manufacturing the tape structure in FIG. 1. Elements in FIGS. 2 to 4 are substantially the same as those in FIG. 1. Thus, the same reference numerals refer to the same elements and any further illustrations with respect to the same elements are omitted herein for brevity.

Referring to FIG. 2, the base layer 110 may be provided and/or formed. The base layer 110 may include a material for supporting the object and provide a layer on which the neutralizing layer 120 and the adhesive layer 130 may be positioned. The base layer 110 may include, e.g., a polyethylene layer, a polypropylene layer, a polybutane layer, a polymethylpentene layer, a polyvinyl chloride layer, a polyethylene terephthalate layer, a polybutylene terephthalate layer, a polybutadiene layer, a polyurethane layer, a polyolefin layer such as an ethylene/vinyl acetate layer, etc.

Referring to FIG. 3, the neutralizing layer 120 may be formed on the base layer 110. The neutralizing layer 120 may include, e.g., a conductive metal, e.g., aluminum (Al), copper (Cu), nickel (Ni), gold (Au), silver (Ag), platinum (Pt), alloys thereof, materials having high electric conductivity, etc. Also, the neutralizing layer 120 may have a thickness capable of preventing the neutralizing layer 120 from being entirely cut during semiconductor chip separation processing. The thickness of the neutralizing layer 120 may be determined in accordance with, e.g., a cost for manufacturing the tape structure 100, storage of the tape structure 100, utilization convenience of the tape structure 100, etc. The thickness of the neutralizing layer 120 may range from, e.g., about 10 μm to about 30 μm. The neutralizing layer 120 may be a foil and/or a mesh that allows the neutralizing layer 120 and the tape structure 100 to expand when required.

Referring to FIG. 4, the adhesive layer 130 may be formed on the neutralizing layer 120 to complete the tape structure 100 in FIG. 1. The adhesive layer 130 may include a material capable of having sufficient adhesion strength when the object and the adhesive layer 130 are partially cut. Example embodiments of the adhesive layer 130 may include, e.g., rubber, acryl, silicon, polyvinyl ether, radiation-hardened materials, heat-foamed type decompression cohesive agents, etc.

Figure 5:
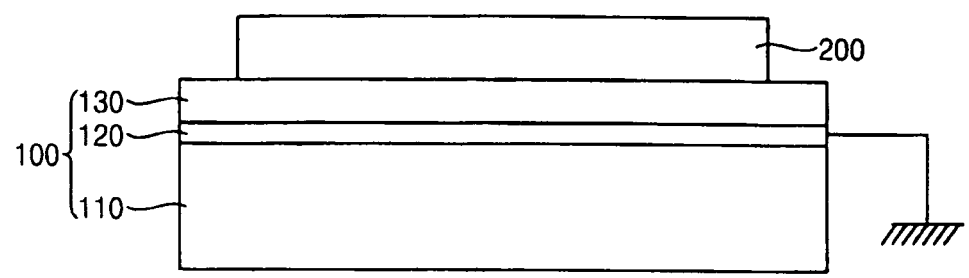
Figure 6:
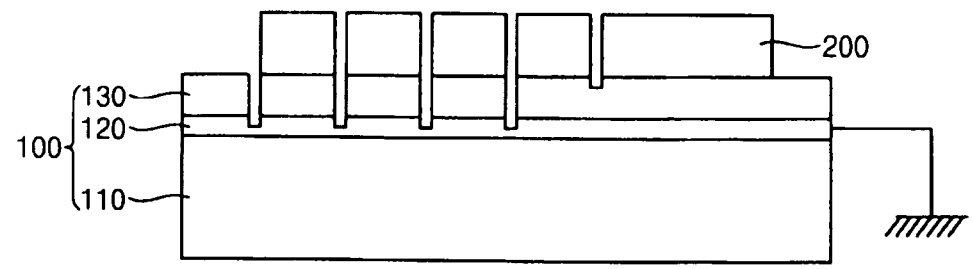
Figure 7:
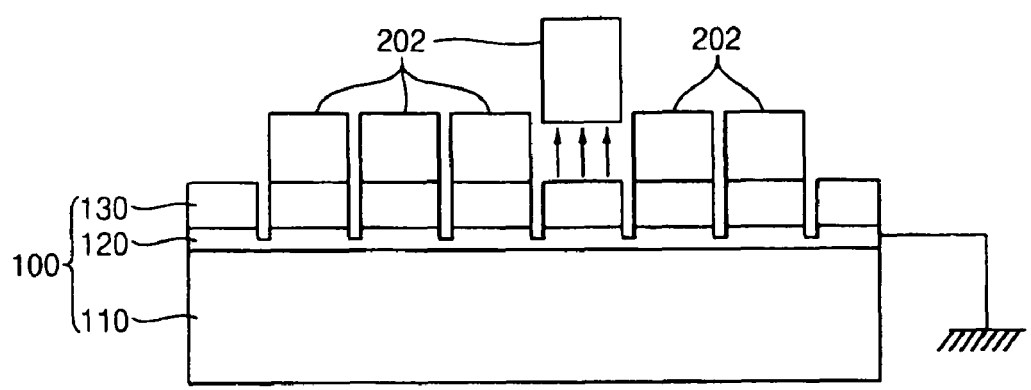

FIGS. 5 to 7 are cross-sectional views illustrating a method of separating a wafer in accordance with example embodiments. Elements in FIGS. 5 to 7 are substantially the same as those in FIG. 1. Thus, the same reference numerals refer to the same elements and any further illustrations with respect to the same elements are omitted herein for brevity.

Referring to FIG. 5, the wafer 200 may be attached to the tape structure 100. The neutralizing layer 120 may be grounded, so that static charges generated when the wafer 200 is attached to the tape structure 100 may be neutralized to prevent deformation and breakage of the wafer 200. Referring to FIG. 6, the wafer 200 may be cut to divide the wafer 200 into the semiconductor chips 202 (as shown in FIG. 7). The wafer 200 may be cut from an upper surface of the wafer 200 to a point between an upper surface and a lower surface of the neutralizing layer 120 to prevent the neutralizing layer 120 from being entirely cut.

Referring to FIG. 7, the cut semiconductor chips 202 may be separated from the tape structure 100. As the neutralizing layer 120 may be grounded, the static charges generated when the semiconductor chips 202 are separated from the tape structure 100, may be neutralized to prevent the deformation and the breakage of the semiconductor chips 202. As shown in FIG. 7, the semiconductor chips 202 may be separated from the adhesive layer 130. Alternatively, the adhesive layer 130 may be separated from the neutralizing layer 120 together with the semiconductor chips 202, and the adhesive layer 130 may then be removed.

Figure 8:
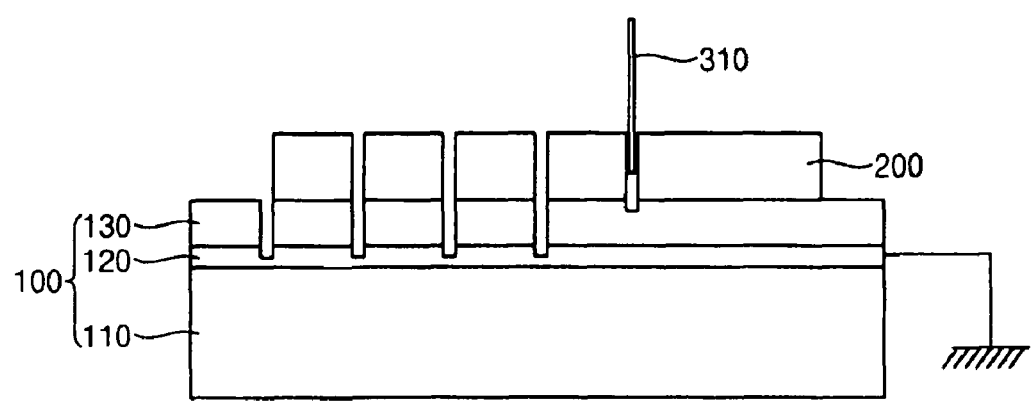
Figure 9:
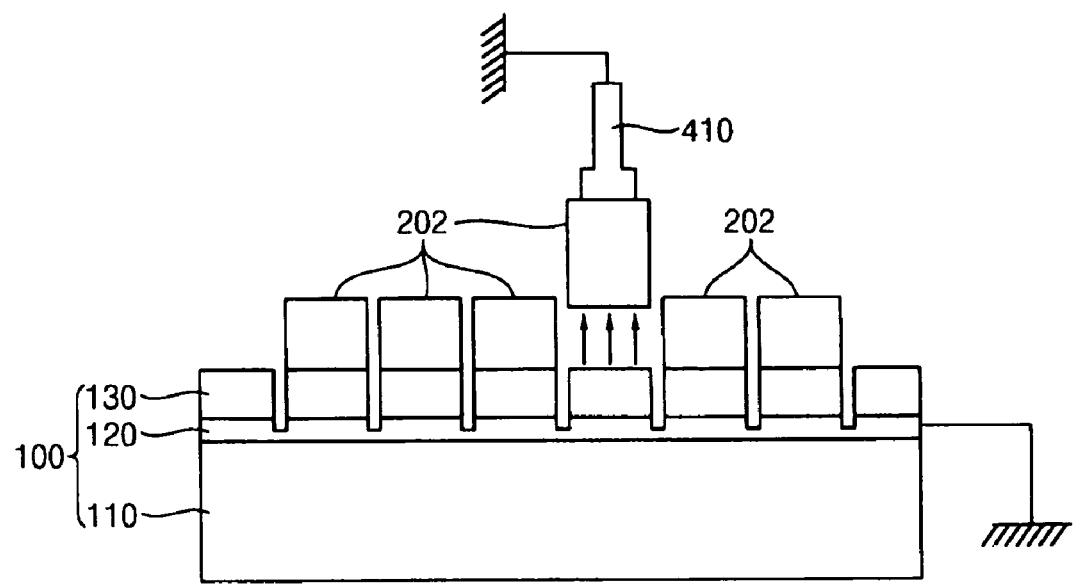

FIGS. 8 and 9 are cross-sectional views illustrating an apparatus for separating a wafer in accordance with example embodiments. Elements in FIGS. 8 and 9 are substantially the same as those in FIG. 1. Thus, the same reference numerals refer to the same elements and any further illustrations with respect to the same elements are omitted herein for brevity.

Referring to FIG. 8, an apparatus for separating a wafer in accordance with example embodiments may include the tape structure 100 and a cutting unit 310. The cutting unit 310 may cut the wafer 200 to divide the wafer 200 into a plurality of semiconductor chips 202. As shown in FIG. 8, the cutting unit 310 may cut the wafer 200 from an upper surface of the wafer 200 to a point between an upper surface and a lower surface of the neutralizing layer 120 to prevent the neutralizing layer 120 from being entirely cut. The cutting unit 310 may include a diamond blade and/or other cutters capable of properly cutting the wafer 200.

Referring to FIG. 9, the apparatus may further include a separating unit 410. The separating unit 410 may separate the cut semiconductor chips 202 from the tape structure 100. In order to prevent static electricity from being generated, the separating unit 410 may be grounded. As the neutralizing layer 120 and the separating unit 410 may be grounded, the charges, which may be caused by static electricity generated when the semiconductor chips 202 are separated from the tape structure 100, may be neutralized to prevent deformation and breakage of the semiconductor chips 202. The separating unit 410 may include e.g., a suction collet, etc.

According to example embodiments, the tape structure may be grounded, so that static electricity may not affect an object fixed to the tape structure. As the tape structure may be used for fixing the wafer, the wafer may be protected from static electricity generated when the wafer is attached to or detached from the tape structure during a process for cutting the wafer.

According to example embodiments the neutralizing layer may be grounded so that static electricity, which may be generated when the object is attached to or separated from the tape structure, is not generated. As a result, the object may not be deformed and/or broken by the static electricity. For example, the tape structure may be grounded to neutralize the charges between the object and the tape structure. Also, the tape structure may be used by changing the structure of the tape, which may be attached to the object, without changing or supplementing processing equipment. Therefore, it may not be necessary to invest and change the additional equipment to prevent the generation of static electricity.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A tape structure comprising:
    a base layer configured to support an object;
    a grounded neutralizing layer on the base layer; and
    an adhesive layer on the grounded neutralizing layer.

2. The tape structure of claim 1, wherein the grounded neutralizing layer is configured to neutralize static charges between the base layer and the object.

3. The tape structure of claim 1, wherein the adhesive layer is configured to attach the object to the tape structure.

4. The tape structure of claim 1, wherein the neutralizing layer comprises a conductive metal.

5. The tape structure of claim 1, wherein the neutralizing layer is a foil or a mesh.

6. An apparatus for separating a wafer, comprising:
    a cutting unit configured to cut the tape structure of claim 1 and an object supported by the base layer of the tape structure, the object being the wafer, the cutting unit being further configured to cut the wafer from an upper surface of the wafer to a point between a lower surface of the neutralizing layer and an upper surface of the neutralizing layer to prevent the neutralizing layer from being completely cut to divide the wafer into a plurality of semiconductor chips.

7. The tape structure of claim 1, wherein the object is a wafer.

8. The tape structure of claim 4, wherein the neutralizing layer has a thickness of about 10 μm to about 30 μm.

9. The apparatus of claim 8, further comprising a separating unit for separating the cut semiconductor chips from the tape structure.

10. The apparatus of claim 6, wherein the cutting unit includes a diamond blade.

11. The apparatus of claim 9, wherein the separating unit is grounded.

12. The apparatus of claim 9, wherein the separating unit comprises a suction collet.

13. A method of manufacturing a tape structure, comprising:
    providing a base layer configured to support an object;
    forming a grounded, neutralizing layer on the base layer; and
    forming an adhesive layer on the neutralizing layer.

14. The method of claim 13, further including providing the object attached to the adhesive layer and supported by the base layer.

15. The method of claim 13, wherein the object is a wafer.

16. The method of claim 14, wherein forming the grounded neutralizing layer includes forming the grounded neutralizing layer to neutralize static charges between the base layer and the object.

17. A method of separating a wafer, comprising:
    attaching the wafer to a tape structure, the tape structure including a base layer configured to supporting the wafer, a grounded neutralizing layer arranged on the base layer, and an adhesive layer arranged on the neutralizing layer; and
    cutting the wafer to divide the wafer into a plurality of semiconductor chips.

18. The method of claim 17, wherein attaching the wafer to the tape structure includes attaching the wafer to the adhesive layer.

19. The method of claim 17, wherein the grounded neutralizing layer is configured to neutralize static charges between the base layer and the wafer.

20. The method of claim 17, further comprising separating the semiconductor chips from the tape structure.

21. The method of claim 17, wherein cutting the wafer includes cutting the wafer from an upper surface of the wafer to a point between an upper surface of the neutralizing layer to and a lower surface of the neutralizing layer to prevent the neutralizing layer from being completely cut.

22. The method of claim 17, wherein the neutralizing layer is a foil or a mesh.

23. The method of claim 20, wherein the neutralizing layer comprises a conductive metal.

24. The method of claim 23, wherein the neutralizing layer has a thickness of about 10 μm to about 30 μm.

* * * * *